(12) United States Patent
Ohishi

(10) Patent No.: US 8,729,493 B2
(45) Date of Patent: May 20, 2014

(54) DRAWING APPARATUS, METHOD OF MANUFACTURING ARTICLE, METHOD OF MANUFACTURING DEFLECTING APPARATUS, AND METHOD OF MANUFACTURING DRAWING APPARATUS

(75) Inventor: Shinji Ohishi, Oyama (JP)

(73) Assignee: Canon Kabushiki Kaisha, Tokyo (JP)

( * ) Notice: Subject to any disclaimer, the term of this patent is extended or adjusted under 35 U.S.C. 154(b) by 23 days.

(21) Appl. No.: 13/294,733

(22) Filed: Nov. 11, 2011

(65) Prior Publication Data

US 2012/0126459 A1    May 24, 2012

(30) Foreign Application Priority Data

Nov. 19, 2010   (JP) ................................ 2010-259293

(51) Int. Cl.
*G21K 5/04*    (2006.01)

(52) U.S. Cl.
USPC .................. 250/397; 250/396 R; 250/492.1; 250/492.3

(58) Field of Classification Search
USPC .......... 250/396 R, 397, 492.1, 492.2, 492.21, 250/492.22, 492.3
See application file for complete search history.

(56) References Cited

U.S. PATENT DOCUMENTS

| 5,834,783 A | 11/1998 | Muraki |
| 5,973,332 A | 10/1999 | Muraki |
| 6,166,387 A | 12/2000 | Muraki |
| 6,323,499 B1 | 11/2001 | Muraki |
| 2003/0189180 A1* | 10/2003 | Hamaguchi et al. ........ 250/492.3 |

FOREIGN PATENT DOCUMENTS

JP    09-245708 A    9/1997

* cited by examiner

*Primary Examiner* — Nicole Ippolito

(74) *Attorney, Agent, or Firm* — Canon USA, Inc. IP Division

(57) ABSTRACT

A drawing apparatus includes a plurality of charged particle optical elements that are sequentially passed through by a plurality of charged particle beams and performs drawing on a substrate with the charged particle beams. The apparatus further includes a deflector array which includes a plurality of deflectors disposed for respective one or more charged particle beams, each of which aligning corresponding one or more charged particle beams between two of the plurality of charged particle optical elements, a plurality of devices configured to respectively apply a plurality of potentials to the deflector array, and a connector configured to connect each of a plurality of electrodes included in the deflector array to one of the plurality of devices and connect electrodes, to which an equal potential is applied, to each other. Number of devices included in the plurality of devices is less than number of electrodes included in the deflector array.

11 Claims, 10 Drawing Sheets

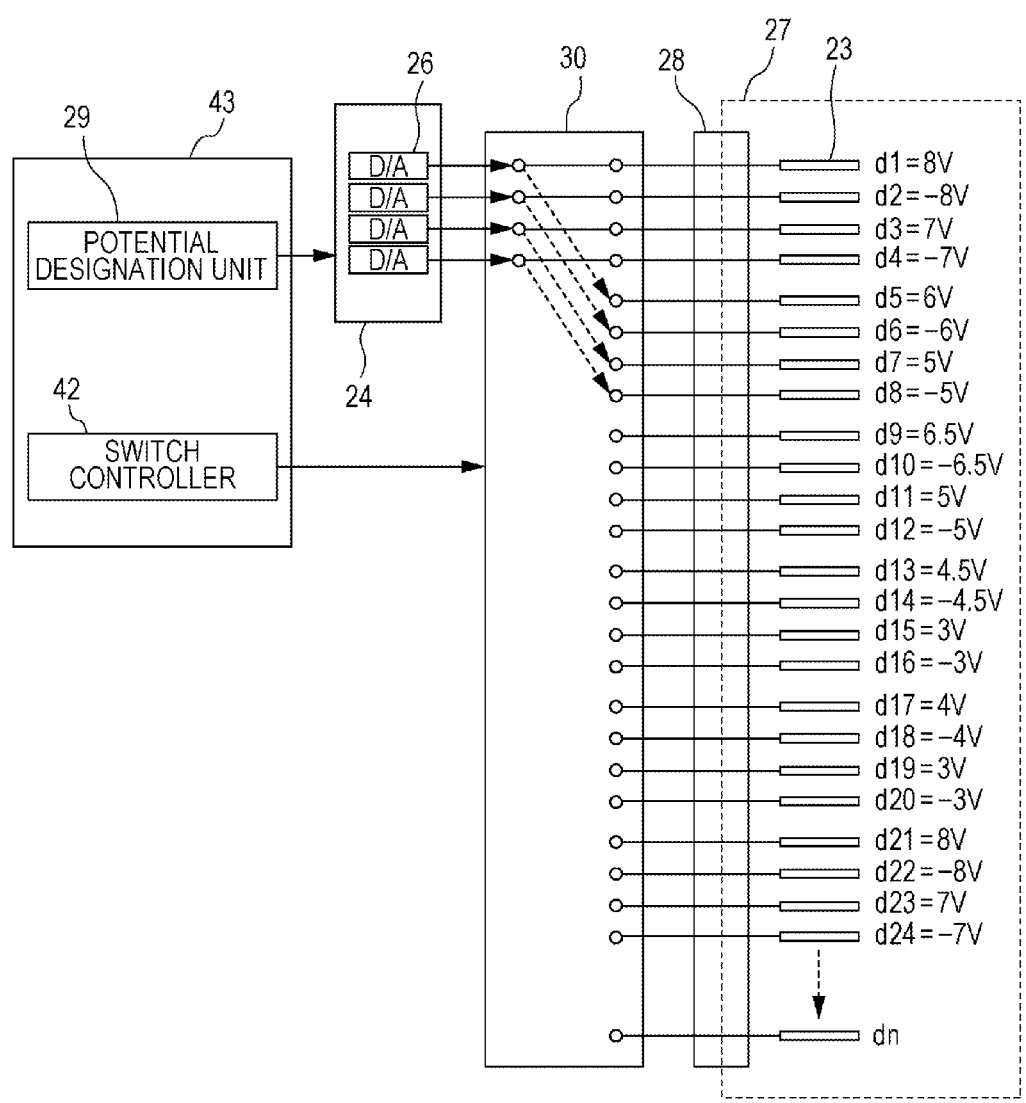

DRAWING APPARATUS, METHOD OF MANUFACTURING ARTICLE, METHOD OF MANUFACTURING DEFLECTING APPARATUS, AND METHOD OF MANUFACTURING DRAWING APPARATUS

BACKGROUND OF THE INVENTION

1. Field of the Invention

Embodiments of the present invention relate to a drawing apparatus configured to perform drawing on a substrate with a plurality of charged particle beams.

2. Description of the Related Art

A drawing apparatus for drawing a pattern on a substrate using a plurality of charged particle beams includes, for example, an aperture array for dividing a charged particle beam emitted by a charged particle source into a plurality of charged particle beams, an electrostatic lens array, a blanker array, a blanking aperture array, etc. There is a limitation on accuracy in aligning corresponding apertures with respect each other between these elements. To handle this difficulty, Japanese Patent Laid-Open No. 09-245708 discloses a drawing apparatus having a deflector array to adjust positions of respective charged particle beams such that the charged particle beams hit correct positions on a substrate. More specifically, in the drawing apparatus disclosed in Japanese Patent Laid-Open No. 09-245708, the deflector array shifts the charged particle beams in parallel such that an image of the charged particle source is formed by each charged particle beam at a predetermined position on the substrate. To drive this deflector array, a plurality of devices (such as digital-analog converters) for supplying potentials (electric potentials) are connected to respective electrodes of the deflector array.

In such a drawing apparatus, its throughput may be increased by increasing the number of charged particle beams used in drawing. However, the increase in the number of charged particle beams results in an increase in the number of electrodes included in the deflector array, and it is necessary to increase the number of devices for applying potentials to the respective electrodes. This may result in an increase in production cost of the drawing apparatus and an increase in necessary installation area size.

SUMMARY OF THE INVENTION

One disclosed aspect of an embodiment of the present invention provides, for example, a drawing apparatus advantageous in terms of fewness of devices for applying potentials to electrodes included in a deflector array therein.

In an aspect, an embodiment of the present invention provides a drawing apparatus which includes a plurality of charged particle optical elements that are sequentially passed through by a plurality of charged particle beams and performs drawing on a substrate with the plurality of charged particle beams, the apparatus comprising a deflector array which includes a plurality of deflectors disposed for respective one or more charged particle beams, each of which aligning corresponding one or more charged particle beams between two of the plurality of charged particle optical elements, a plurality of devices configured to respectively apply a plurality of potentials to the deflector array, and a connector configured to connect each of a plurality of electrodes included in the deflector array to one of the plurality of devices and connect electrodes, to which an equal potential is applied, to each other, wherein number of devices included in the plurality of devices is less than number of electrodes included in the deflector array.

Thus, the drawing apparatus according to an aspect of the embodiment includes the reduced number devices for applying potentials to the electrodes included in the deflector array.

Other objects and advantages besides those discussed above shall be apparent to those skilled in the art from the description of a preferred embodiment of the invention which follows. In the description, reference is made to accompanying drawings, which form apart thereof, and which illustrate an example of the embodiment. Such example, however, is not exhaustive of the various embodiments of the invention, and therefore reference is made to the claims which follow the description for determining the scope of the invention.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 4 is a diagram illustrating a configuration of a control system to set potential designating values.

DESCRIPTION OF THE EMBODIMENTS

Disclosed aspects of embodiments may be described in further detail below with reference to embodiments in conjunction with the accompanying drawings.

First Embodiment

Figure 1:
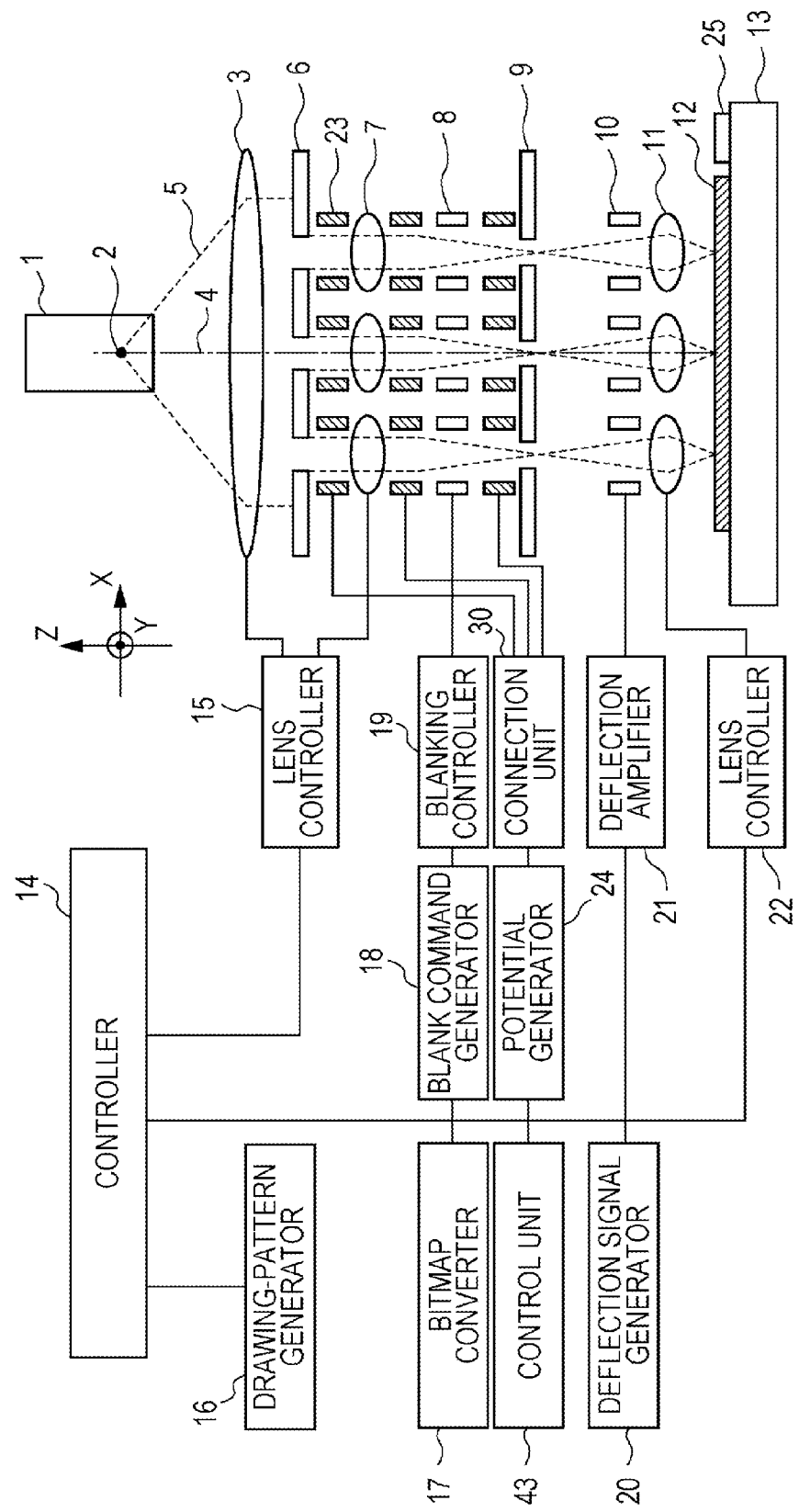
FIG. 1 is a diagram illustrating a configuration of a drawing apparatus.

FIG. 1 illustrates a drawing apparatus configured to draw a pattern on a substrate using a plurality of charged particle beams. In the following description, it is assumed by way of example that electron beams are used as the charged particle beams. However, the charged particle beam is not limited to the electron beam, but other charged particle beams such as ion beams may be used. A configuration and an operation of the drawing apparatus are described below. In FIG. 1, an electron gun 1 serves as an electron beam source that generates an electron beam with a crossover 2. Electrons emitted in a divergent manner from the crossover 2 travel, for example, along trajectories 4 and 5. The electron beam diverged from the crossover 2 is formed into a parallel electron beam by a collimator lens 3 and is incident on an aperture array 6.

The aperture array 6 has a plurality of circular-shaped openings arranged in the form of a matrix to divide the incident electron beam into a plurality of electron beams. The plurality of electron beams emerging from the aperture array 6 are incident on a first electrostatic lens array 7. The first electrostatic lens array 7 includes, for example, three electrode plates having a plurality of circular-shaped openings (in FIG. 1, the three electrode plates are not shown for simplicity). A blanking aperture array 9 having small openings arranged in the form of a matrix is disposed at a place at which crossovers of the respective electron beams are formed by the first electrostatic lens array 7. Blanking of the electron beams by the blanking aperture array 9 is performed by deflecting the electron beams using a blanker array 8.

The blanker array 8 is controlled by a blanking controller 19. More specifically, the blanking controller 19 controls the blanker array 8 in accordance with a blanking signal generated by a blank command generator 18. A drawing pattern is generated by a drawing pattern generator 16 and converted into bitmap data by a bitmap converter 17. According to the bitmap data, the blank command generator 18 generates the blanking signal. After the electron beams pass through the blanking aperture array 9, each of the electron beams forms an image of the crossover 2 on a substrate 12 via a second electrostatic lens array 11.

The substrate 12 is held on a stage 13 which is moved by an actuator (not shown). When a pattern is being drawn by the drawing apparatus, the substrate 12 is continuously moved in an X-ray direction by the stage 13. During the drawing operation, the position of the substrate 12 is measured in real time by a laser distance measuring apparatus (not shown). According to a result of the measurement, the respective electron beams are deflected by a deflector array 10 such that the electron beams are scanned in a Y direction along target trajectories, and blanked by a blanker array 8 such that a target beam intensity is obtained on the substrate 12 for each electron beam. The deflector array 10 is controlled by a deflection amplifier 21. More specifically, the deflection amplifier 21 controls the deflector array 10 according to a deflection signal generated by a deflection signal generator 20. The collimator lens 3 and the first electrostatic lens array 7 are controlled by a lens controller 15, and the second electrostatic lens array 11 is controlled by the lens controller 22.

Aligner deflector arrays (aligning deflector arrays) 23 have one of three functions described below. A first function is to deflect the respective electron beams emerging from the aperture array 6 such that each electron beam is incident on a particular position of the first electrostatic lens array 7. A second function is to deflect the respective electron beams such that each electron beam emerging from the first electrostatic lens array 7 is incident on a particular position of the blanker array 8. A third function is to deflect the respective electron beams such that each electron beam emerging from the blanker array 8 is incident on a particular position of the blanking aperture array 9. In the example shown in FIG. 1, to achieve the three functions described above, the aligner deflector arrays 23 are disposed at three different locations. Note that the aligner deflector array 23 may be disposed at least one location in the path of electron beams such that the electron beams are deflected. The aligner deflector array 23 may be provided for each electron beam or for a plurality of electron beams Potentials necessary to deflect the electron beams are applied from a potential generator 24 to the aligner deflector array 23 via a connection unit (connector) 30. The potentials generated by the potential generator 24 are set by a control unit (potential controller) 43. Potential designating values applied to the potential generator 24 are determined by the control unit 43 according to outputs from a detector 25 that detects the positions of the electron beams. Although in the present embodiment, the detector 25 is disposed on the stage 13, the detector 25 may be disposed at another location. For example, the detector 25 may be disposed at one or more locations in paths of the electron beams. Thus, the drawing operation is performed by the units described above under the control of the controller 14. Here, the whole of the controller 14 and another (other) controller(s) or control unit(s) for controlling an element (respective elements) of the drawing apparatus of FIG. 1 may be referred to as a 'controller'.

Figure 2:
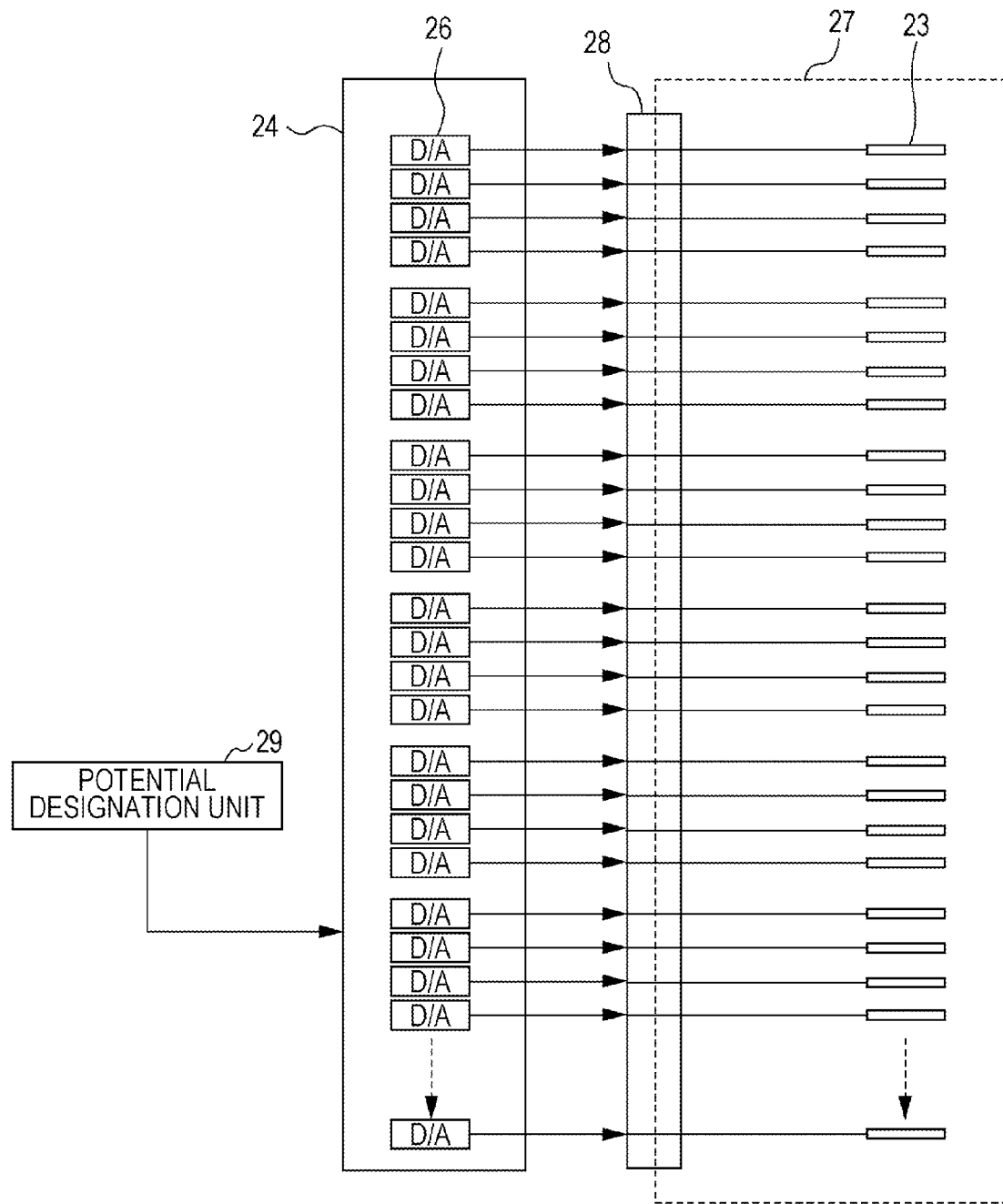
FIG. 2 is a diagram illustrating a comparative example of a control system of a deflector.

Next, a comparative example of a configuration of a deflector control system is described below with reference to FIG. 2. To drive the aligner deflector array 23, the potential generator 24 includes D/A converters (digital-analog converters) 26 functioning as devices that apply potentials to electrodes of the aligner deflector array 23. Each of the D/A converters 26 generates a potential corresponding to a designated potential (commanded potential) sent from a potential designation unit 29 included in the control unit 43. In this comparative example, there are as many devices for applying potentials as there are electrodes of the aligner deflector array. Note that drawing a pattern on the substrate using the electron beams is performed in a vacuum environment, and the aligner deflector array 23 is disposed together with other elements (electron beam optical elements) in a vacuum chamber 27. Thus, signal transmission between the outside and the inside of the vacuum chamber 27 is performed via a vacuum feedthrough connector 28.

Figure 3A:
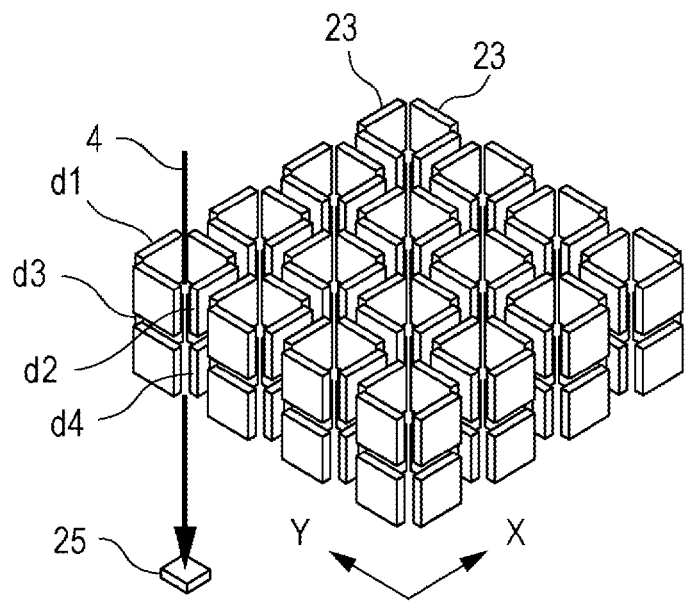
FIG. 3A is a perspective view illustrating an example of a manner of determining a potential designating value (potential commanding value)
Figure 3B:
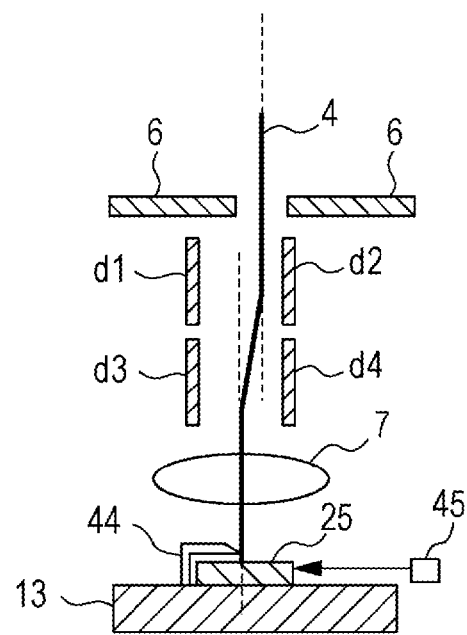
FIG. 3B is a cross-sectional view illustrating in further detail the manner of determining the potential designating value.

FIG. 3A is a perspective view illustrating an example of a manner of determining a potential designating value. FIG. 3B is a cross-sectional view illustrating in further detail the example of the manner of determining the potential designating value. The aligner deflector array 23 includes electrode pairs (a plurality of pairs of electrodes) each opposing each other in a direction along an X-ray axis and electrode pairs each opposing each other in a direction along a Y axis. When each electron beam passes between electrode pairs, the electron beam is deflected by an amount corresponding to a potential difference between the two electrodes. As a result, the electron beam travels, for example, along a trajectory such as that represented by a reference numeral 4 in FIG. 3A or 3B. In the example shown in FIGS. 3A and 3B, one electron beam is deflected by one electrode pair. However, a plurality of electron beams may be deflected by one electrode pair. For convenience of illustration, electrodes of the aligner deflector array 23 are denoted by reference symbols d1 to d4.

The role of the aligner deflector array 23 is to control each electron beam emerging from the aperture array 6 to pass through a predetermined particular position (for example, the center of a corresponding electrostatic lens) of the electrostatic lens array 7. To achieve this, it is necessary to adjust the potentials of the respective electrodes (d1, d2, d3, d4, etc.) of the aligner deflector array 23. Note that the aligner deflector array 23 may be disposed between two arbitrary electron beam optical elements to deflect the electron beams between the two elements so as to align the electron beams.

Next, an explanation is given below as to an example of a procedure of determining potential designating values corresponding to the respective electrodes of the aligner deflector array 23. As shown in FIG. 3B, the electron beam detector 25 for detecting electron beams is disposed on the stage 13. In FIG. 3B, the electrostatic lens array 7 is located close to the stage 13. Actually, however, there are other elements between them although they are not shown in FIG. 3B. The electron beam detector does not necessarily need to be disposed on the stage 13, but it may be disposed on a dedicated stage. Alternatively, a single or a plurality of dedicated stages may be disposed in a removable manner at an arbitrary location on an electron beam path.

A knife edge 44 is disposed on the detector 25. There is also disposed a position detector 45 for detecting the location of the electron beam detector 25. Using these units/devices, first, the stage 13 is positioned according to the output from the position detector 45 such that the location of the knife edge 44 is coincident with the center of a corresponding lens of the electrostatic lens array 7. In this state, while the potentials applied to the respective electrodes (d1, d2, d3, and d4) of the upper and lower electrode pairs are changed, the intensity of the electron beam is measured using the electron beam detector 25. When the electron beam is incident on the center of the lens of the electrostatic lens array 7, one half of the electron beam is blocked by the knife edge 44 such that the intensity of the electron beam becomes one-half the intensity in the state where the electron beam is not blocked at all. Via the above process, the potential designating values for the respective electrodes are determined. Alternatively, the potential designating values may be determined by calculation without performing the measurement on the electron beams. More specifically, for example, the potential designating values may be calculated based on production information (about dimensions, locations, etc., of the respective elements) of the electron beam optical system including the electron beam optical elements.

FIG. 4 illustrates a control system configured to set the potential designating values. For convenience of illustration, electrodes of the aligner deflector array 23 are denoted by reference symbols d1 to dn. The potential generator 24 includes D/A converters 26 for applying potentials to the respective electrodes of the aligner deflector array 23. The connection unit 30 includes a first set of terminals connected in a one-to-one manner to the D/A converter 26 in the potential generator 24 and a second set of terminals connected in a one-to-one manner to the electrodes (d1 to dn) in the aligner deflector array 23. The connection unit 30 electrically connects terminals in the first set of terminals to terminals in the second set of terminals such that the potentials determined in the above-described manner are applied to the electrodes. A switch controller 42 in the control unit 43 outputs a command signal to switch connections between the terminals in the connection unit 30. Because the aligner deflector array 23 is located in the vacuum chamber 27, the signal transmission between the inside and the outside of the vacuum chamber 27 is performed via a vacuum feedthrough connector 28. Although in the present embodiment, by way of example, the D/A converters 26 are used as devices for applying potentials, variable output power supplies or the like may be used.

The number of electrodes in the aligner deflector array 23 is proportional to the number of aligner deflectors. If the number of electron beams is increased to increase the throughput of the drawing apparatus, the number of aligner deflectors increases correspondingly. For example, as many as a few hundred aligner deflectors are necessary. Thus the number of electrodes in the aligner deflector array 23 increases with the number of aligner deflectors.

As may be seen from FIG. 3B, initial values of designated potentials corresponding to the respective electrodes are determined in units of two electrode sets, i.e., upper and lower sets of electrode (including a total of four electrodes) for deflecting the electron beam in directions along the X and Y axes. More specifically, for example, electrodes (d1, d2, d3, and d4) are first connected to corresponding D/A converters 26, and designated potentials of the respective electrodes are determined. Next, electrodes (d5, d6, d7, and d8) are connected to the D/A converters 26 (via the connection unit 30 as represented by dotted lines in FIG. 4) in response to the signal supplied from the switch controller 42, and designated potentials of the respective electrodes are determined. The designated potentials may be determined as described above with reference to FIGS. 3A and 3B. The above operation is repeated for the other electrodes. An example of a set of designated potentials determined in the above-described manner is shown in FIG. 4. In this example, the designated potentials are determined as d1=8 V, d2=−8 V, d3=7 V, d4=−7 V, and so on.

Figure 5:
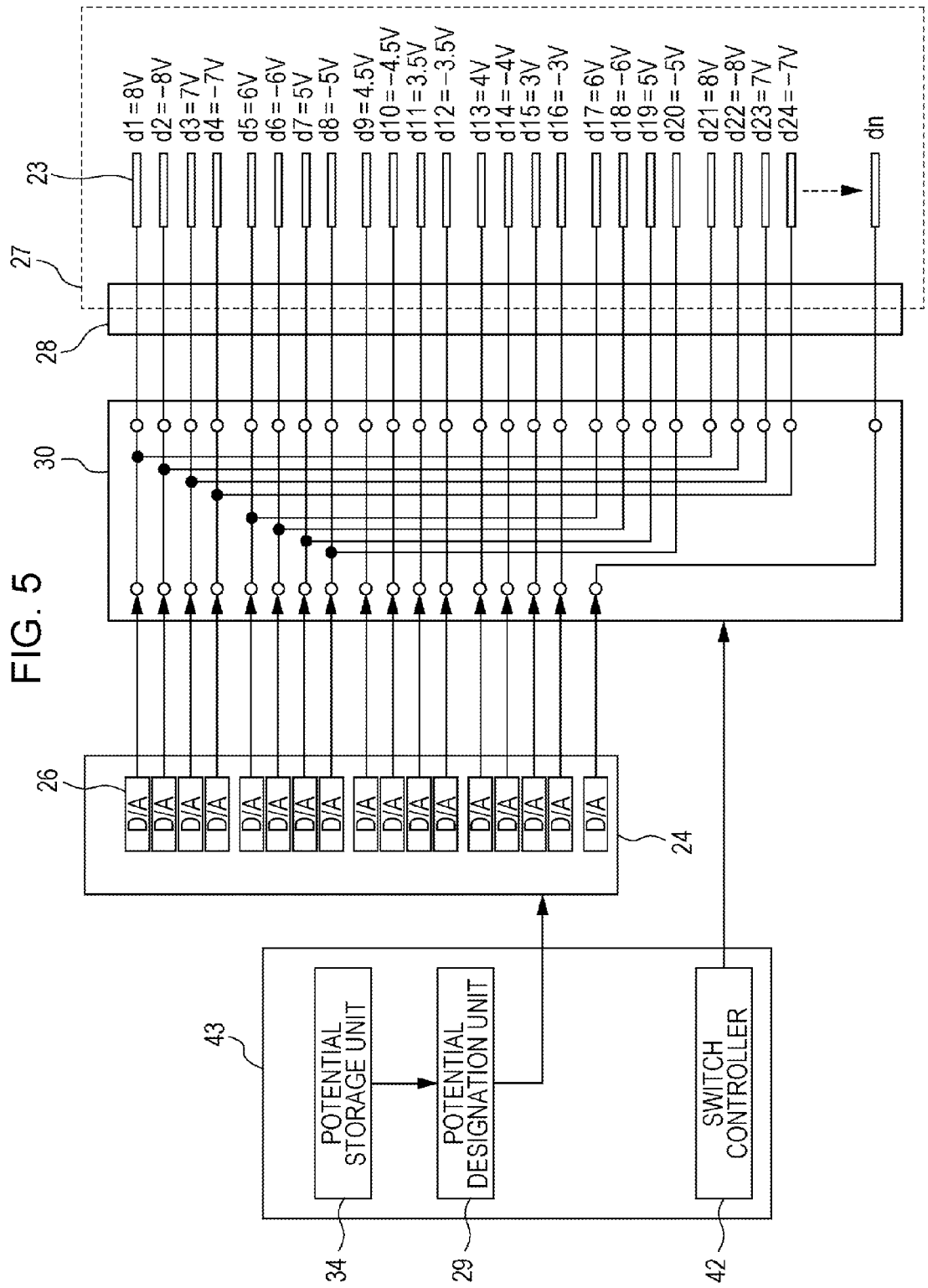
FIG. 5 is a diagram illustrating a configuration of a control system of an aligner deflector array according to an embodiment of the present invention.

FIG. 5 illustrates a control system configured to control the aligner deflector array according to the present embodiment of the invention. In the present embodiment, the control unit 43 includes a potential storage unit 34 for storing the designated potentials determined in the above-described manner for the respective electrodes of the aligner deflector array 23. In accordance with the information stored in the potential storage unit 34 as to the designated potentials corresponding to the respective electrodes, the control unit 43 controls the switch controller 42 to switch the connection state of the connection unit 30 between the first set of terminals and the second set of terminals. For example, of the electrodes of the aligner deflector array 23, electrodes described below are equal in designated potential, i.e., designated potential are equal between electrodes d1 and d21, between electrodes d2 and d22, between electrodes d3 and d23, between electrodes d4 and d24, between electrodes d5 and d17, between electrodes d6 and d18, between electrodes d7 and d19, and between electrodes d8 and d20. Therefore, in each set of electrodes that are equal in designated potential, electrodes are connected together by the connection unit 30 as shown in FIG. 5.

By connecting the electrodes in the above-described manner, it becomes unnecessary to provide as many devices such as D/A converters 26 for applying potentials as there are electrodes in the aligner deflector array 23, but it becomes sufficient to provide as many devices for applying potentials as required to drive the aligner deflector array 23. Thus, the number of devices for applying potentials becomes smaller than the number of electrodes of the aligner deflector array 23. That is, the drawing apparatus according to the present embodiment of the invention has an advantage that the drawing apparatus needs a small number of devices for applying potentials to the electrodes of the aligner deflector array 23.

Figure 6:
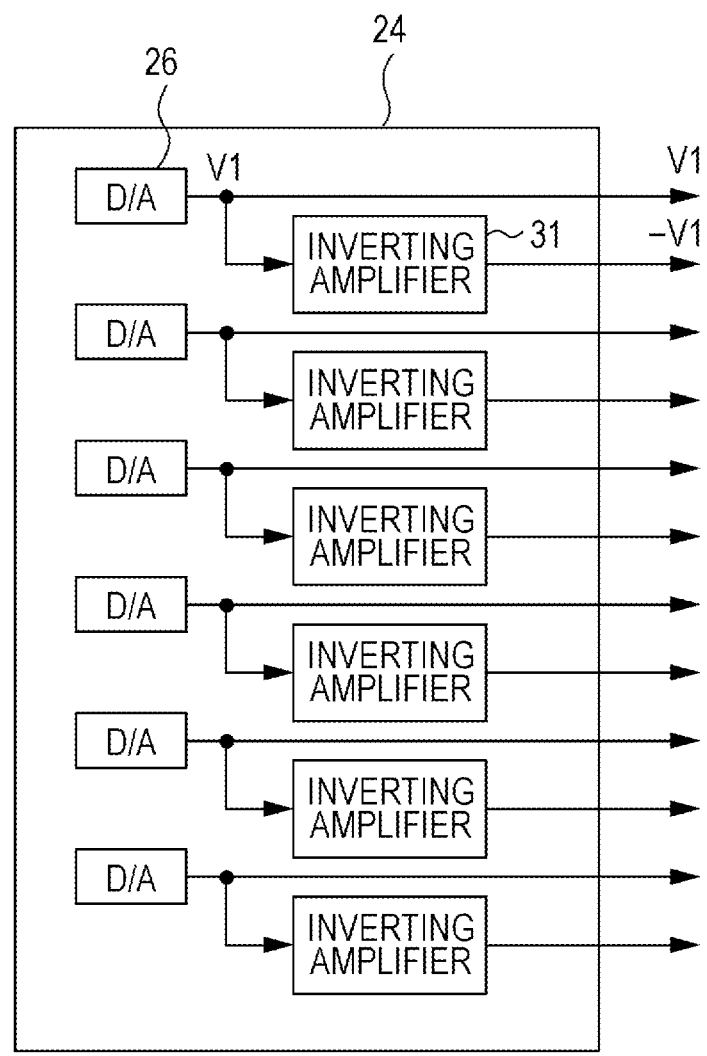
FIG. 6 is a diagram illustrating an example of a configuration of a potential generator.

FIG. 6 illustrates another example of a configuration of the potential generator 24. In this example shown in FIG. 6, each device for applying a potential includes one D/A converter 26 and one polarity inverting amplifier 31. In each device, the D/A converter 26 outputs a particular potential (V1) and the polarity inverting amplifier 31 inverts the polarity of this particular potential (V1) and outputs a resultant potential (−V1). This makes it possible to generate as many potentials as twice the number of D/A converters 26. Note that the D/A converters may be replaced by variable output power supplies or fixed-output power supplies.

Figure 7:
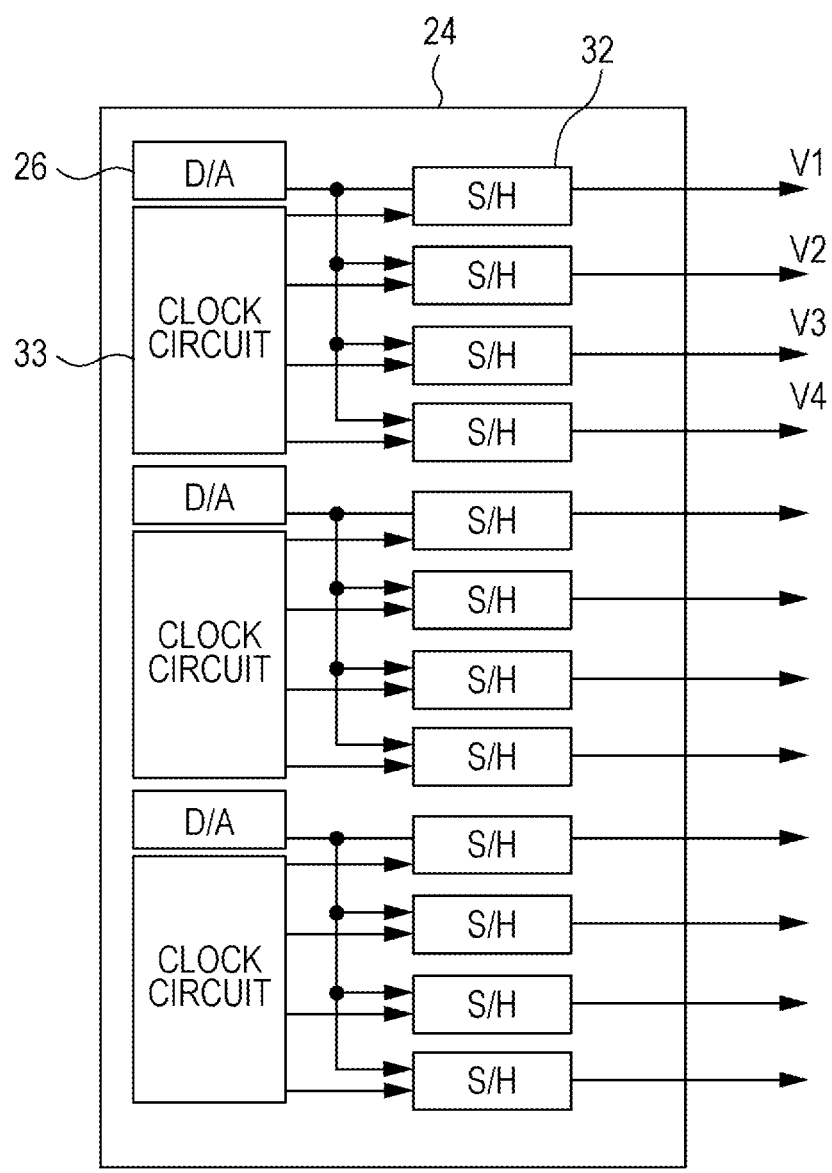
FIG. 7 is a diagram illustrating an example of a configuration of a potential generator.

FIG. 7 illustrates still another example of a configuration of the potential generator 24. In this example shown in FIG. 7, each device for applying a potential includes a S/H (sample-and-hold) amplifier 32. An output signal from each D/A converter 26 is input to a set of a plurality of S/H amplifiers 32 arranged in parallel. The respective S/H amplifiers 32 arranged in parallel sample and hold the output signal from the D/A converter 26 in a time-division manner according to an output signal from a clock circuit 33. Thus, the S/H amplifiers 32 arranged in parallel may output different potentials (V1, V2, V3, and V4 in the example shown in FIG. 7).

Figure 8A:
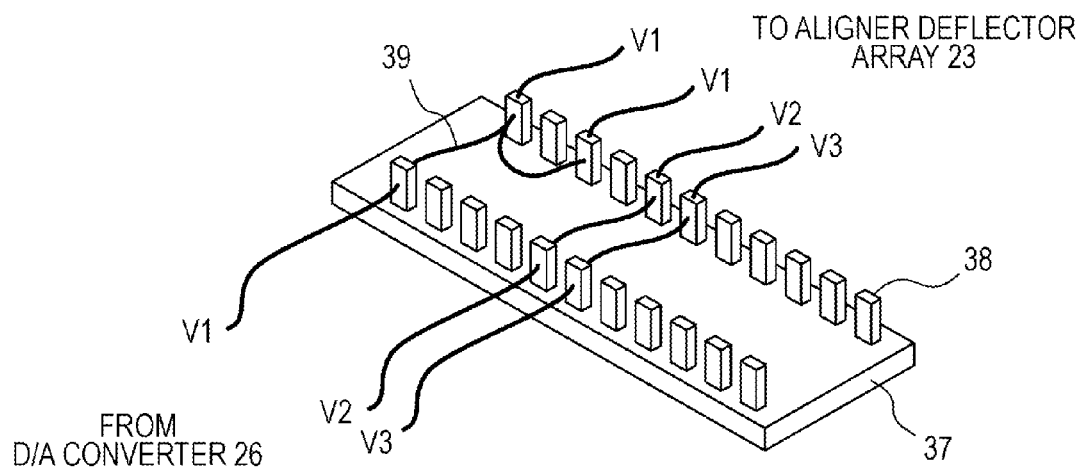
FIG. 8A is a diagram illustrating an example of a configuration of a connection unit.
Figure 8B:
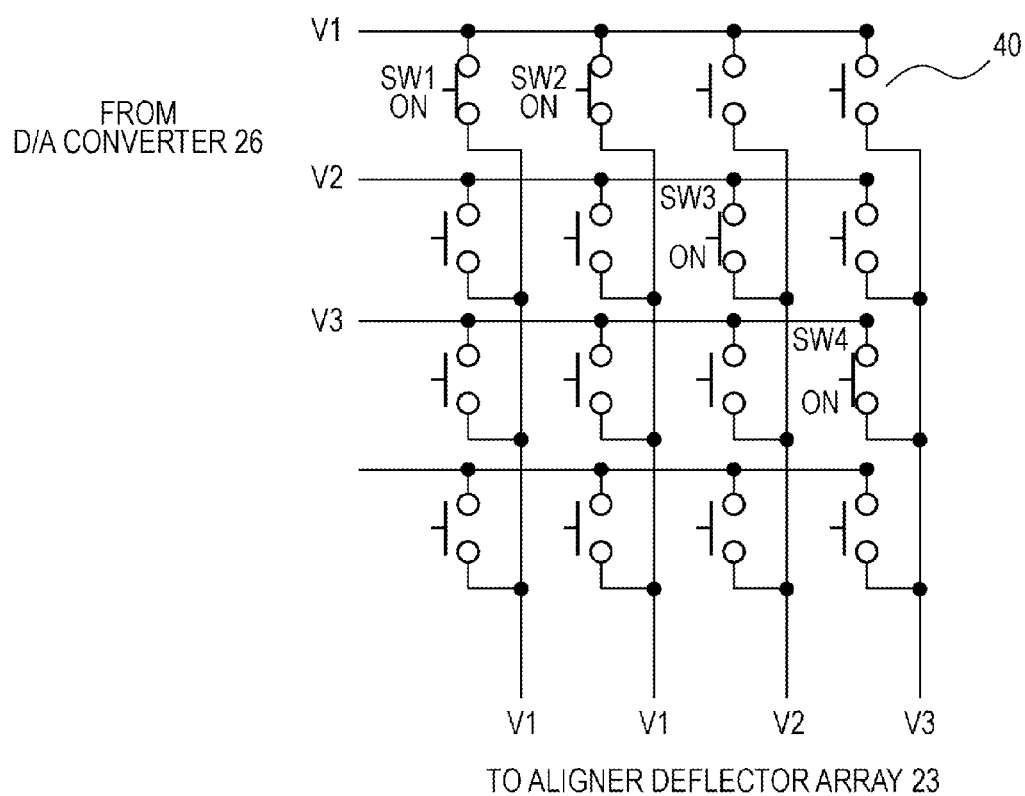
FIG. 8B is a diagram illustrating another example of a configuration of a connection unit.

FIG. 8A illustrates an example of a configuration of the connection unit 30, and FIG. 8B illustrates another example of a configuration of the connection unit 30. As described above, the connection unit 30 connects electrodes together which are equal in designated potential and connects devices for applying designated potentials to corresponding electrodes. In the example shown in FIG. 8A, the connection unit 30 is realized using a terminal board (terminal unit) 37. A plurality of wiring pins 38 are disposed on the terminal board 37. The wiring pins 38 include those corresponding to the first set of terminals and those corresponding to the second set of terminals. Electrodes that are equal in terms of the designated potential are connected together via a wiring cable 39. Electrodes and devices for applying designated potentials are connected via wiring cables 39. The number of wiring pins 38 is determined depending on the number of electrodes. Wiring cables 39 may be connected to corresponding wiring pins 38 by wire-lapping, soldering, screw-fastening, etc. By employing the terminal board 37 configured in the above-described manner, it is possible to realize the connection unit 30 at low cost although connecting wiring cables 39 to wiring pins 38 may be somewhat time-consuming.

In the example shown in FIG. 8B, the connection unit 30 is realized using switching elements (electrical switches) 40 arranged in the form of a matrix. The number of switching elements is determined depending on the number of electrodes. In the specific example shown in FIG. 8B, a switching element SW1 and a switching element SW2 are turned on to connect together two electrodes assigned the same designated potential V1 and to supply the same designated potential V1 to these two electrodes. On the other hand, a switching element SW3 is turned on to apply a potential V2 to one electrode, and a switching element SW4 is turned on to apply a potential V3 to another electrode. The connection unit 30 configured in the above-described manner allows it to quickly connect the potential generator 24 to the electrodes of the aligner deflector array 23. It is also allowed to flexibly change the connection state.

In the above description, the embodiment of the invention is applied to the aligner deflector array. Note that the present embodiment of the invention is also applicable to other deflector arrays to reduce the number of devices for applying potentials to electrodes. For example, the embodiment of the invention may be applied to the blanker array 8 that deflects the electron beams to blank the electron beams and/or to the deflector array 10 that deflects the electron beams to scan the electron beams in a main direction. Thus, the present embodiment of the invention makes it possible to achieve a drawing apparatus including a less number of devices for applying potentials to the electrodes of the deflector array.

Second Embodiment

Figure 9:
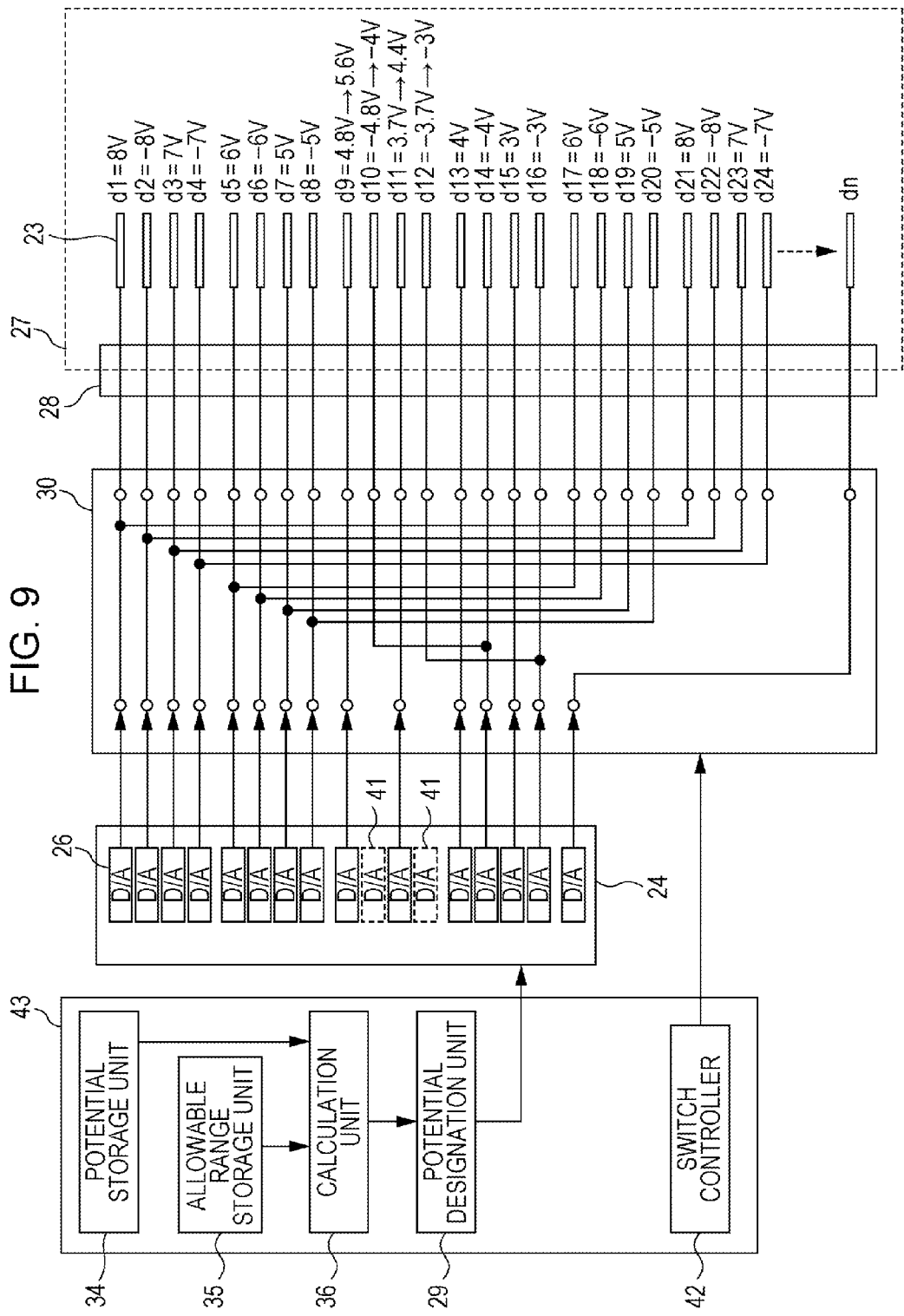
FIG. 9 is a diagram illustrating a configuration of a control system of an aligner deflector array according to an embodiment of the present invention.

FIG. 9 illustrates a control system configured to control the aligner deflector array according to a second embodiment of the invention. An electrostatic-type aligner deflector array 23 deflects electron beams according to voltage differences between opposing electrodes. This means that when potentials of two opposing electrodes are changed while maintaining the potential difference between the two opposing electrodes, no change occurs in amount of deflection of the electron beam. However, in practice, if changes in potentials are great, interference of electric field may occur between adjacent pairs of electrodes, which may reduce accuracy of controlling the position of the electron beam. In view of the above, the allowable maximum change (allowable range) in potential is predetermined taking into account the position control accuracy, and the potentials are changed within the determined allowable range. This makes it possible to change potentials applied to the electrodes without substantially changing the amount of deflection of the electron beams.

Referring to FIG. 9 an explanation is given below as to a system configuration and a procedure of changing the designated potentials corresponding to the electrodes of the aligner deflector array 23 so as to reduce the number of D/A converters 26. An allowable range storage unit (a storage for storing a tolerance) 35 stores the allowable range (a tolerance) of change in the potential. A calculation unit 36 performs a calculation to change the potentials stored in the potential storage unit 34 within the allowable range stored in the allowable range storage unit 35 and stores the changed potentials.

Next, an example of a procedure of reducing the number of D/A converters 26 is described below. For example, designated potentials corresponding to particular electrodes of the aligner deflector array 23 are shifted by +0.8 V such that the designated potential of d9 is shifted from 4.8 V to 5.6 V, and the designated potential of d10 is shifted from −4.8 V to −4.0 V. Furthermore, designated potentials corresponding to particular electrodes of the aligner deflector array 23 are shifted by +0.7 V such that the designated potential of d11 is shifted from 3.7 V to 4.4 V, and the designated potential of d12 is shifted from −3.7 V to −3.0 V. As a result, d10 and d14 have an equal designated potential of −4.0 V, and thus they may be connected together via the connection unit 30. Similarly, d12 and d16 have an equal designated potential of −3.0 V, and thus they may be connected together via the connection unit 30. By changing the potentials in the above-described manner, it becomes unnecessary to generate the old designated potential of −4.8 V for d10 and the old designated potential of −3.7 V for d12, and thus it becomes possible to reduce the number of D/A converters 41.

As described above, designated potentials may be changed while maintaining the voltage difference between electrodes in each electrode pair of the deflector such that at least one of potentials of electrodes of an electrode pair of a deflector becomes equal to one of potentials of electrodes of an electrode pair of another deflector. To reduce the total number of designated potentials, the calculation unit 36 changes designated potentials stored in the potential storage unit 34 within the allowable range stored in the allowable range storage unit 35. Thus, the present embodiment of the invention makes it possible to reduce the total number of devices for applying potentials to a level greatly smaller than the total number of electrodes of the deflector array.

Third Embodiment

Figure 10:
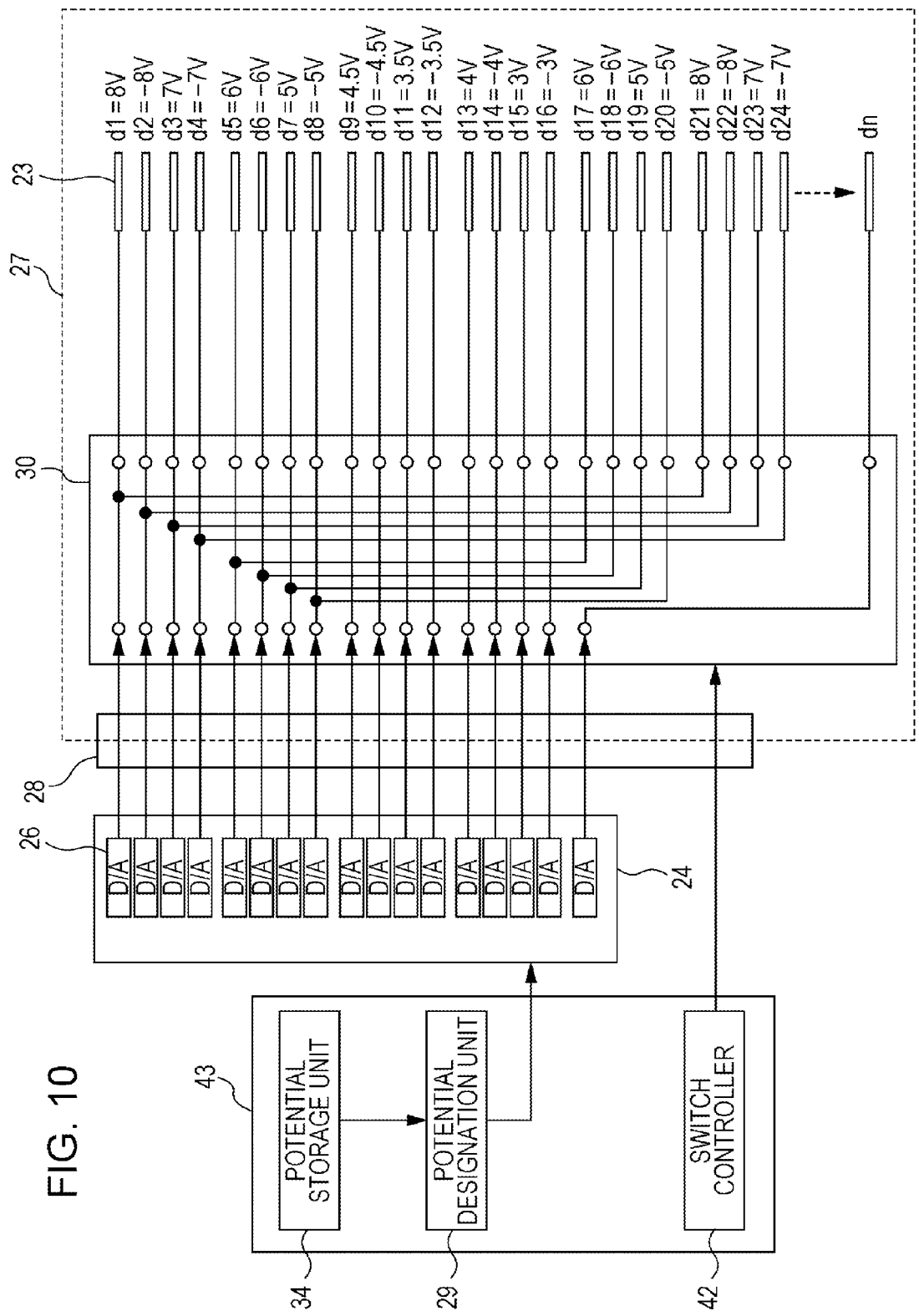
FIG. 10 is a diagram illustrating a configuration of a control system of an aligner deflector array according to an embodiment of the present invention.

FIG. 10 illustrates a control system configured to control the aligner deflector array according to a third embodiment of the invention. In the present embodiment, the connection unit 30 according to the first or second embodiment is disposed in the vacuum chamber 27. The present embodiment allows a reduction in the number of cables (signal lines) connected to the vacuum feedthrough connector 28. The vacuum feedthrough connector 28 connects signal lines from the potential generator 24 to the same number of control lines to the connection unit 30 as the number of signal lines from the potential generator 24. Note that the number of signal lines from potential generator 24 may be reduced according to the first or second embodiment. Control lines between the switch controller 42 and the connection unit 30 are also connected to the vacuum feedthrough connector 28. The number of control lines may be reduced by employing serial communication, and thus it is possible to reduce the total number of pins of the vacuum feedthrough connector 28.

As described above, the present embodiment of the invention makes it possible to reduce the scale of the vacuum feedthrough connector, which makes it easy to perform electrical installation of the drawing apparatus.

Fourth Embodiment

A fourth embodiment of the invention is described below in terms of a method of producing the deflecting apparatus including the deflector array and a method of producing the drawing apparatus including such a deflecting apparatus. First, the method of producing the deflecting apparatus is described. An explanation will be omitted as to the points that are clear from the description given in the first to third embodiments.

The deflecting apparatus produced according to the present embodiment includes a deflector array (for example, the aligner deflector array 23) for deflecting a plurality of charged particle beams, and a plurality of devices (for example, D/A converters 26) for applying a plurality of potentials to the deflector array. The deflecting apparatus also includes a connection unit (for example, the connection unit 30) for connecting each of a plurality of electrodes of the deflector array to one of the plurality of devices. In the method of producing the deflecting apparatus configured in the above-described manner, a first step is to detect a position of a charged particle beam corresponding to one of deflectors in the deflector array. Next, based on a result of the detection, a plurality of potentials to be applied to a plurality of electrodes of the deflector are determined. Furthermore, as many devices for applying the potentials are provided as there are determined potentials. Next, the connection unit is configured such that each of the electrodes is connected to a corresponding one of the devices, and such that electrodes assigned equal potentials are connected to each other. By employing the production method described above, it is possible to produce the deflecting apparatus including the control system of the deflector array according to one the first to third embodiments.

In the production method described above, the plurality of potentials may be determined as follows. That is, two potentials applied respectively to two electrodes of one electrode pair included in the deflector array are changed while maintaining the voltage difference between the two electrodes of the one electrode pair such that at least one of the two electrodes of the one electrode pair becomes equal to at least one of two electrodes of another electrode pair included in the deflector array. The changing of the potentials may be performed such that amounts of changes in potentials are within a predetermined range.

Next, the method of producing the drawing apparatus is described. An explanation will be omitted as to the points that are clear from the description given in the first to third embodiments. In the method of producing the drawing apparatus configured to draw a pattern on a substrate using a plurality of charged particle beams, a first step is to assemble a projection system that includes the deflecting apparatus and that projects the plurality of charged particle beams onto the substrate. The step includes producing the deflecting apparatus according to the production method described above. By employing the production method described above, it is possible to produce the drawing apparatus configured according to one of the first to third embodiment of the invention.

Fifth Embodiment

A fifth embodiment of the present invention is described in terms of a method producing an article such as a device having a microstructure, for example, a microdevice such as a semiconductor device. The production method may include forming a latent pattern in a photosensitizing agent coated on a substrate by using the drawing apparatus (i.e., drawing the pattern on the substrate) and developing the latent pattern formed on the substrate. The production method may include additional steps such as oxidation, film formation, vacuum evaporation, doping, planarization, etching, resist removal, dicing, bonding, packaging, etc. The method of producing the article according to the present embodiment of the invention may provide an advantage in terms of at least one of following items: performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-259293 filed Nov. 19, 2010, which is hereby incorporated by reference herein in its entirety.

What is claimed is:

1. A drawing apparatus which includes a plurality of charged particle optical elements that are sequentially passed through by a plurality of charged particle beams, and performs drawing on a substrate with the plurality of charged particle beams, the apparatus comprising:
    a deflector array which includes a plurality of deflectors, including a plurality of electrodes, each of which disposed for corresponding one or more charged particle beams and aligning the corresponding one or more charged particle beams between two of the plurality of charged particle optical elements;
    a plurality of devices configured to respectively apply a plurality of potentials to the deflector array; and
    a connector including wirings and configured such that each of the plurality of electrodes and one of the plurality of devices are interconnected via one of the wirings, and electrodes, to which an equal potential is applied, of the plurality of electrodes are connected to a single wiring of the wirings,
    wherein number of devices included in the plurality of devices is less than number of electrodes included in the plurality of electrodes.

2. An apparatus according to claim 1, further comprising:
    a detector configured to detect a charged particle beam corresponding to one deflector included in the deflector array; and
    a controller configured to determine the plurality of potentials based on an output from the detector.

3. An apparatus according to claim 2, wherein the controller is configured to determine the plurality of potentials by changing two potentials applied respectively to two electrodes of a pair of electrodes included in the plurality of electrodes while maintaining a potential difference between the two electrodes such that a potential of at least one of the two electrodes becomes equal to a potential of at least one of two electrodes of another pair of electrodes included in the plurality of electrodes.

4. An apparatus according to claim 3, wherein the controller is configured to change the two potentials such that an amount of change of each of the two potentials is within a predetermined range.

5. An apparatus according to claim 2, wherein
the connector includes a plurality of switching elements for setting a state of connection between the plurality of electrodes and the plurality of devices, and
the controller is configured to store the determined plurality of potentials, and to control the plurality of switching elements in accordance with the stored plurality of potentials.

6. An apparatus according to claim 1, further comprising:
a vacuum chamber in which the deflector array is disposed and the drawing is performed, the vacuum chamber including a vacuum feedthrough,
wherein the plurality of devices are disposed outside the vacuum chamber, the connector is disposed inside the vacuum chamber, and each of the plurality of electrodes is connected to one of the plurality of devices via the vacuum feedthrough.

7. A method of manufacturing an article, the method comprising:
performing drawing on a substrate using a drawing apparatus;
developing the substrate on which the drawing has been performed; and
processing the developed substrate to manufacture the article,
wherein the drawing apparatus includes a plurality of charged particle optical elements that are sequentially passed through by a plurality of charged particle beams and performs drawing on the substrate with the plurality of charged particle beams, the apparatus including:
a deflector array which includes a plurality of deflectors, including a plurality of electrodes, each of which disposed for corresponding one or more charged particle beams and aligning the corresponding one or more charged particle beams between two of the plurality of charged particle optical elements;
a plurality of devices configured to respectively apply a plurality of potentials to the deflector array; and
a connector including wirings and configured such that each of the plurality of electrodes and one of the plurality of devices are interconnected via one of the wirings, and electrodes, to which an equal potential is applied, of the plurality of electrodes are connected to a single wiring of the wirings,
wherein number of devices included in the plurality of devices is less than number of electrodes included in the plurality of electrodes.

8. A method of manufacturing a deflecting apparatus including a deflector array which includes a plurality of deflectors, including a plurality of electrodes, each of which disposed for corresponding one or more charged particle beams and aligning the corresponding one or more charged particle beams between two of a plurality of charged particle optical elements, a plurality of devices configured to respectively apply a plurality of potentials to the deflector array, and a connector including wirings and configured to perform connection of each of the plurality of electrodes to one of the plurality of devices, the method comprising:
performing detection of a position of a charged particle beam corresponding to one deflector included in the deflector array;
performing determination of a plurality of potentials applied to the plurality of electrodes based on the detection;
providing the plurality of devices of which number of devices is same as number of potentials of the determined plurality of potentials; and
causing the connector to perform the connection such that each of the plurality of electrodes and one of the plurality of devices are interconnected via one of the wirings, and electrodes, to which an equal potential is applied, of the plurality of electrodes are connected to a single wiring of the wirings.

9. A method according to claim 8, wherein the determination determines the plurality of potentials by changing two potentials applied respectively to two electrodes of a pair of electrodes included in the plurality of electrodes while maintaining a potential difference between the two electrodes such that a potential of at least one of the two electrodes becomes equal to a potential of at least one of two electrodes of another pair of electrodes included in the plurality of electrodes.

10. A method according to claim 9, wherein the determination changes the two potentials such that an amount of change of each of the two potentials is within a predetermined range.

11. A method of manufacturing a drawing apparatus for performing drawing on a substrate with a plurality of charged particle beams, the method comprising:
assembling a projection system that includes a deflecting apparatus and projects the plurality of charged particle beams onto the substrate,
wherein the deflecting apparatus is manufactured using a method defined in claim 8.

* * * * *